United States Patent
Jordanov

(10) Patent No.: US 6,587,003 B2
(45) Date of Patent: Jul. 1, 2003

(54) CHARGE SENSITIVE PREAMPLIFIER WITH PULSED SOURCE RESET

(75) Inventor: Valentin T. Jordanov, Durham, NH (US)

(73) Assignee: Canberra Industries. Inc., Meridan, CT (US)

( * ) Notice: Subject to any disclaimer, the term of this patent is extended or adjusted under 35 U.S.C. 154(b) by 48 days.

(21) Appl. No.: 09/836,721

(22) Filed: Apr. 18, 2001

(65) Prior Publication Data

US 2002/0153957 A1 Oct. 24, 2002

(51) Int. Cl.[7] ............................................. H03F 3/08
(52) U.S. Cl. ...................... 330/308; 330/86; 330/110; 250/214 A
(58) Field of Search .............................. 330/308, 110, 330/86; 250/214 A

(56) References Cited

U.S. PATENT DOCUMENTS

| | | | | | |
|---|---|---|---|---|---|
| 4,415,803 A | * | 11/1983 | Muoi | ...................... | 250/214 A |
| 4,498,001 A | * | 2/1985 | Smoot | ...................... | 250/214 A |
| 4,623,786 A | * | 11/1986 | Rodwell | ...................... | 250/214 A |
| 5,347,231 A | * | 9/1994 | Bertuccio et al. | ............ | 330/300 |
| 5,714,909 A | * | 2/1998 | Jackson | ....................... | 330/308 |
| 5,793,254 A | * | 8/1998 | O'Connor | ................... | 330/282 |
| 6,057,738 A | * | 5/2000 | Ku et al. | ..................... | 330/308 |
| 6,084,232 A | * | 7/2000 | Kimura | .................. | 250/214 A |
| 6,323,730 B1 | * | 11/2001 | Hynd | .......................... | 330/311 |
| 6,329,881 B1 | * | 12/2001 | Tachigori | .................... | 330/308 |

FOREIGN PATENT DOCUMENTS

EP         89300335.0         7/1989

* cited by examiner

Primary Examiner—Michael Tokar
Assistant Examiner—Khai M. Nguyen
(74) Attorney, Agent, or Firm—John H. Crozier

(57) ABSTRACT

In a preferred embodiment, a charge sensitive preamplifier for a radiation detector, including: an amplifier having a JFET input (stage) and a capacitive feedback element, the amplifier producing an output voltage (pulse) proportional to a charge (pulse) deposited at the JFET input by the radiation detector; and circuitry connected to the amplifier output and to a source node of the JFET to provide to the source node a pulsed reset signal.

22 Claims, 6 Drawing Sheets

Preamplifier with pulsed source reset.

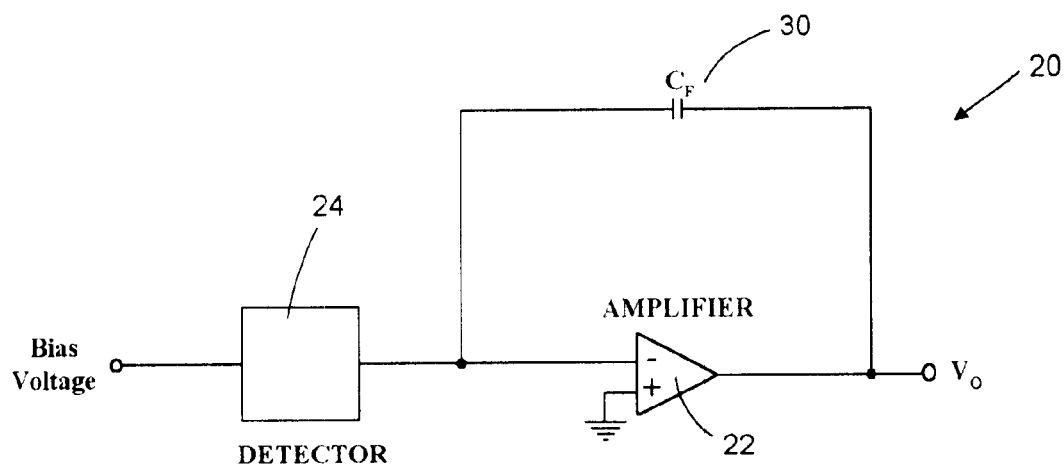
Fig. 1. Basic Charge Sensitive Amplifier
(Prior Art)
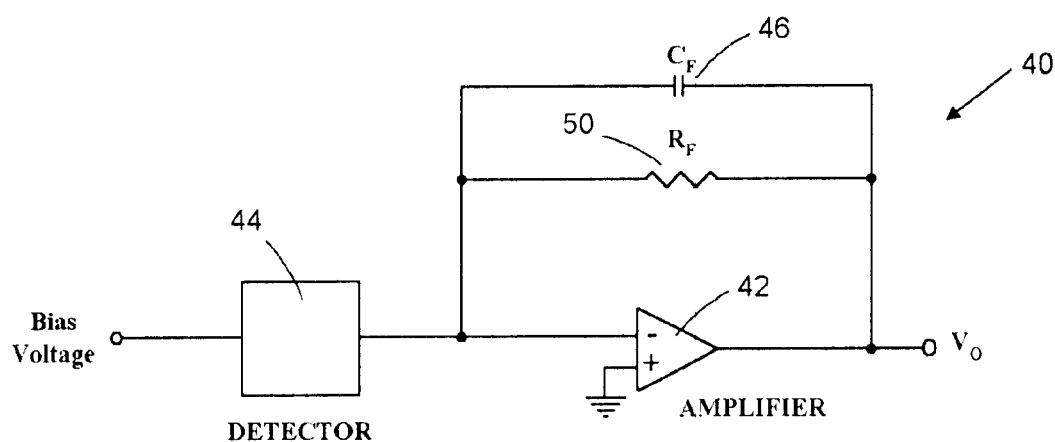
Fig. 2. Resistive Feedback Charge Sensitive Amplifier
(Prior Art)

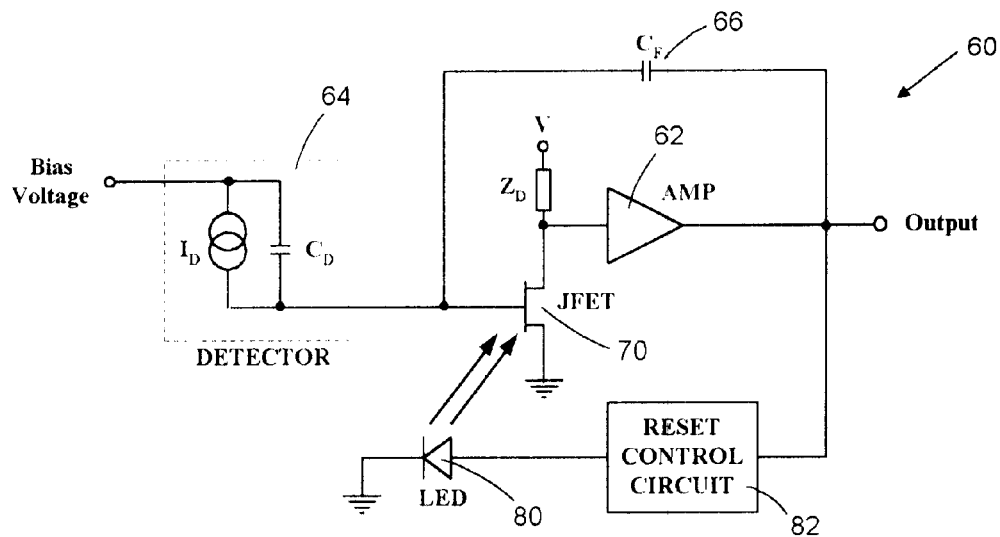
Fig. 3. Preamplifier with pulsed optical feedback.
(Prior Art)
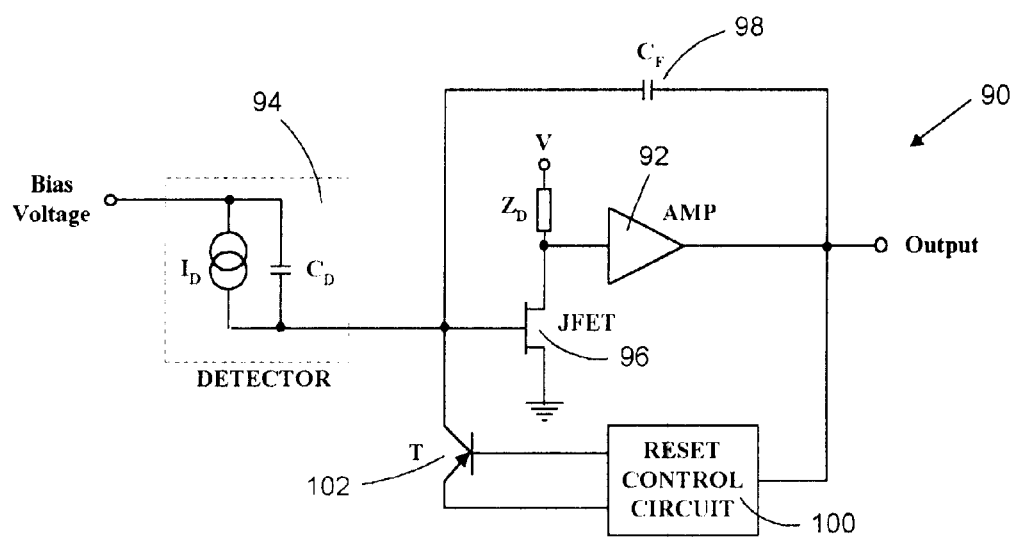
Fig. 4. Transistor reset preamplifier.
(Prior Art)

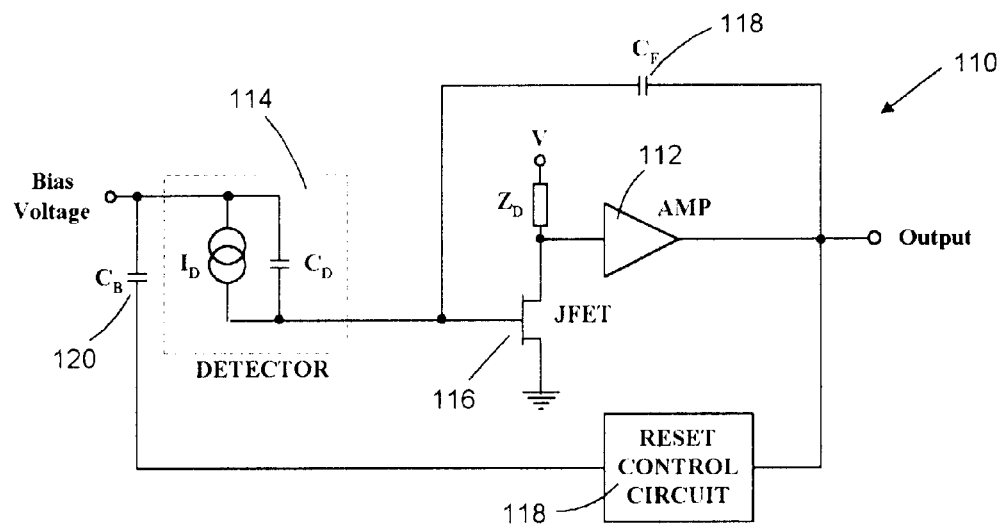
Fig. 5. Preamplifier with pulsed feedback through detector capacitance.
(Prior Art)
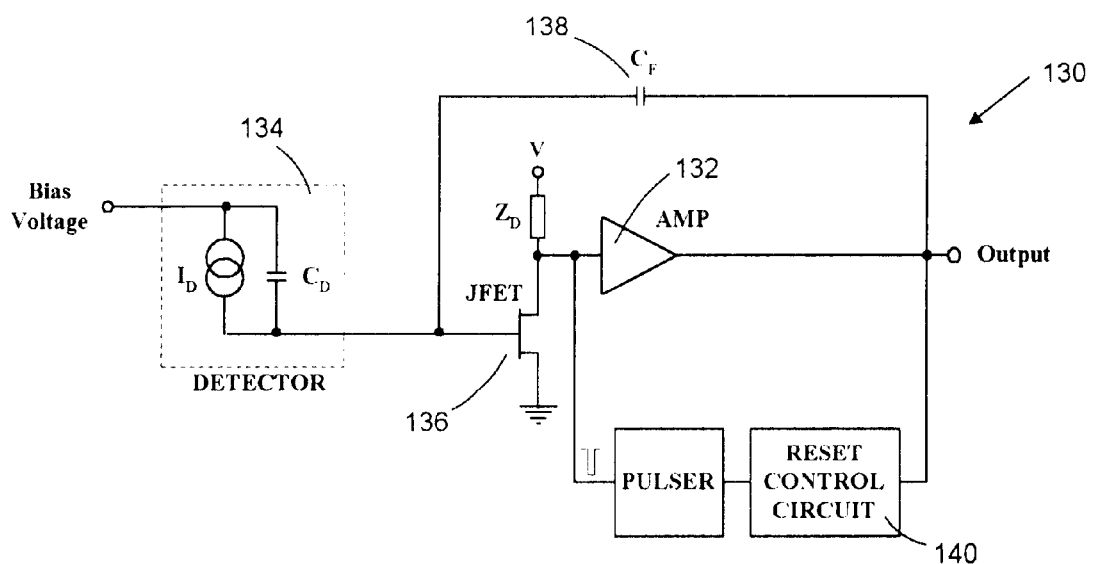
Fig. 6 Preamplifier with pulsed drain feedback.
(Prior Art)

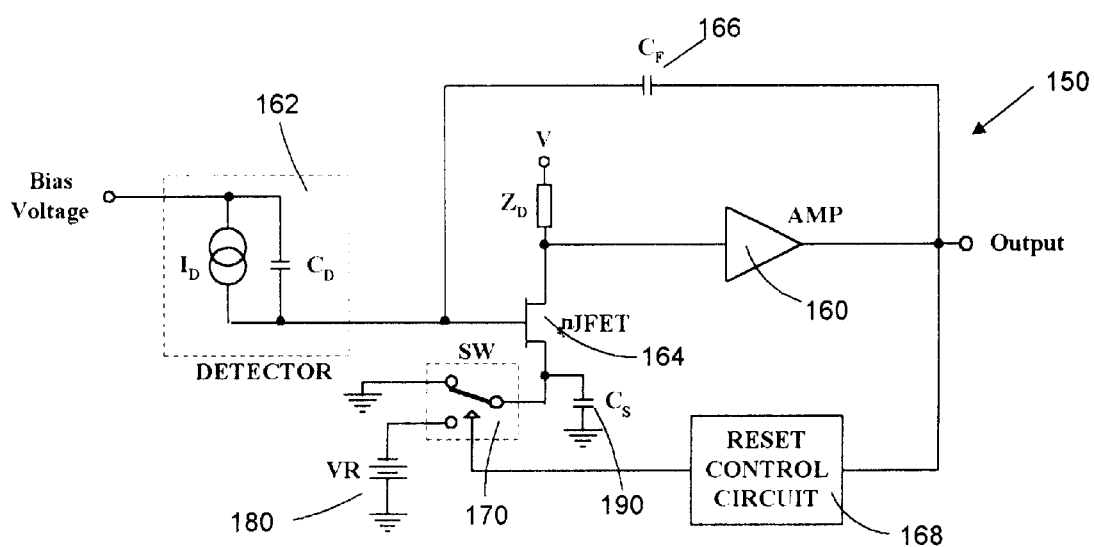
Fig. 7. Preamplifier with pulsed source reset.

Practical realization of preamplifier with pulsed source feedback.

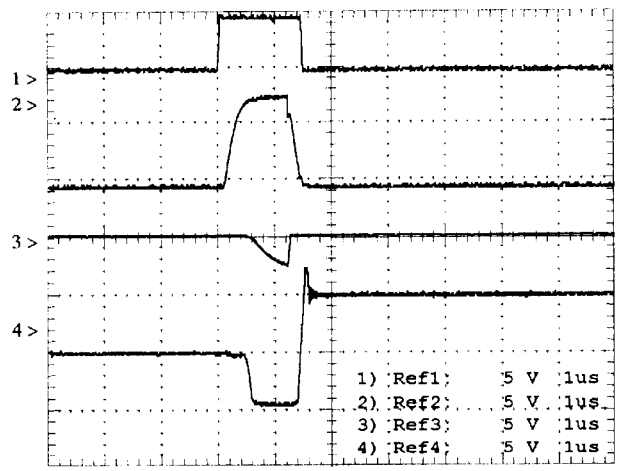
Fig. 9. Oscilloscope traces of a preamplifier with pulsed source feedback during reset. Trace 1 is the output of CMP, trace 2 is the output of the PULSE GENERATOR, trace 3 is the voltage at the JFET source node, and trace 4 is the output of the preamplifier.
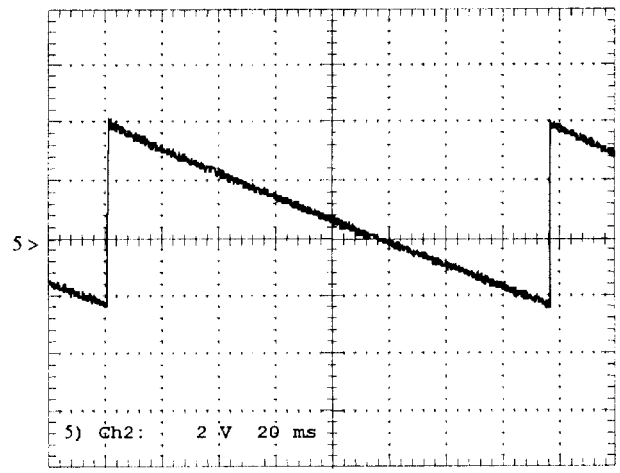
Fig. 10 Output of the preamplifier with small leakage current, 6V reset magnitude.

CHARGE SENSITIVE PREAMPLIFIER WITH PULSED SOURCE RESET

BACKGROUND OF THE INVENTION

1. Field of the Invention

The present invention relates to charge sensitive preamplifiers which are used to convert the charge signals from semiconductor radiation detectors to voltage pulses, that are in turn shaped and analyzed for pulse height, the pulse height being proportional to the energy deposited in the detector by each photon or particle striking the detector and, more particularly, but not by way of limitation to a novel method of re-setting the preamplifier which is fast, free of spurious effects, and which adds little noise to the signal. The new method can be used with detectors requiring either positive or negative bias voltage.

2. Background Art

Semiconductor radiation detectors produce a current pulse with an integrated charge that is proportional to the energy deposited in the detector by each photon or particle interaction. Charge sensitive amplifiers (preamplifiers) are used to convert this charge to a voltage pulse for further shaping, amplification, and analysis. The quality of the preamplifier signal plays a large role in the performance of the detector. Specifically, preamplifier noise is a strong contributor to resolution degradation. The resolving ability, i.e., the ability of a radiation detector to distinguish or resolve small differences in the energy levels of photons or particles is the paramount measure of detector quality. For this reason, preamplifier design and manufacture is rich in both proprietary and public prior art In its simplest embodiment, a charge sensitive preamplifier is a closed-loop amplifier with a capacitive feedback element. Charge deposited at the input node unbalances the amplifier that responds by making a step function change in output sufficient to inject an equal but opposite charge at the input node—thereby re-balancing the circuit.

In the usual event that signals continue to occur one after another, the preamplifier will eventually saturate, that is, the output voltage will reach the limit of the dynamic range of the amplifier and no further signals can be processed. To remedy this situation, a large value resistor is added in parallel with the feedback capacitor. This resistor provides a continuous discharge path for the charge stored in the capacitor and, thus, the preamplifier will remain in operation as long as the detector current does not exceed the current capacity (given the output voltage limit of the preamplifier) of the feedback resistor.

Unfortunately, the feedback resistor is a source of noise, which degrades the resolution of the detector. There have been many innovations in preamplifier design to overcome the feedback resistor noise problem including optical feedback, pulsed optical feedback, and transistor reset methods. U.S. Pat. No. 5,347,231 and T. Lakatos, G. Hegyesi, and G. Kalinda, *Nucl. Instr. and Meth.*, A378, pg. 683 (1996), contain detailed overviews of preamplifier reset techniques and refer to a number of relevant publications.

A number of other references describe various methods of resetting. These include:

Optical feedback in U.S. Pat. No. 3,611,173. This technique results in an output signal whose shape varies with count rate and which cannot be shaped and processed with integrity.

Pulsed-optical feedback in D. A. Landis, F. S. Goulding, and J. M. Jakelvic, *Nucl. Inst. and Meth.*, 87, pg. 211 (1970); and D. A. Landis et al., *IEEE Trans. Nucl. Sci.*, NS-18 (1), pg. 115 (1971). Disadvantages are that the light must be isolated from the detector element, the JFET employed can take a long time for full recovery following illumination, and the circuit does not work for positively biased detectors.

Transistor reset preamplifier in D. A. Landis et al., *IEEE Trans. Nucl. Sci.*, NS-29 (1), pg. 619 (1982). The additional capacitance of the JFET employed on the input of the preamplifier exacts a heavy penalty in noise, so these preamplifiers are not suitable for low energy detectors where noise plays a large role in detector resolution.

Switches that are integrated in the JFET itself as well as JFETs having an additional electrode serving as an injector to provide reset current in U.S. Pat. No. 5,170,229. Such innovations cannot be used with the great variety of commercially available JFETs that are useful for the range of detectors in common use.

Resetting by forward biasing the gate-source junction in V. Radeka, *IEEE Trans. Nucl Sci.*, NS-17 (3), pg. 433 (1970). Proper operation of this circuit depends on the detector capacitance which may not be stable and with some detectors the electrode structure may prevent efficient reset and may cause polarization of secondary electrodes as a result of resetting.

Resetting by forward biasing the drain-gate junction of the JFET in N. W. Madden et al., *IEEE Trans. Nucl, Sci.*, NS-37 (2), pg. 171 (1990). Because of the circuit arrangement, it is not possible to incorporate a circuit to limit the drain voltage excursion during reset.

In addition, European Patent Application No. 89300335.0, titled JUNCTION FIELD EFFECT TRANSISTORS, describes a device that may be used as a high impedance charge or current amplifier and which may be used to restore charge.

Accordingly, it is a principal object of the invention to provide a preamplifier that overcomes previous methods and employs a new method of re-setting that is fast.

It is a further object of the invention to provide such a preamplifier that is free of spurious effects.

It is an additional object of the invention to provide such a preamplifier that adds little noise to the signal.

It is another object of the invention to provide such a preamplifier that can be used with detectors requiring either positive or negative bias voltages.

Other objects of the invention will become apparent from, or will be elucidated in, the following description and on the accompanying drawing figures.

SUMMARY OF THE INVENTION

The present invention achieves the above objects, among others, by providing, in a preferred embodiment, a charge sensitive preamplifier for a radiation detector, comprising: an amplifier having a JFET input (stage) and a capacitive feedback element, said amplifier producing an output voltage (pulse) proportional to a charge (pulse) deposited at said JFET input by said radiation detector; and circuitry connected to said amplifier output and to a source node of said JFET to provide to said source node a pulsed reset signal.

BRIEF DESCRIPTION OF THE DRAWING

Understanding of the present invention and the various aspects thereof will be facilitated by reference to the accompanying drawing figures, provided for purposes of illustration only and not intended to define the scope of the invention, on which:

FIG. 1 is a block/schematic diagram of a basic charge sensitive amplifier.

FIG. 2 is a block/schematic diagram of a conventional resistive feedback charge sensitive preamplifier.

FIG. 3 is a block/schematic diagram of a conventional preamplifier with pulsed optical feedback.

FIG. 4 is a block/schematic diagram of a conventional transistor reset preamplifier.

FIG. 5 is a block/schematic diagram of a conventional preamplifier with pulsed feedback through detector capacitance.

FIG. 6 is a block/schematic diagram of a conventional preamplifier with pulsed drain feedback.

FIG. 7 is a block/schematic diagram of a preamplifier with pulsed source reset, according to the present invention.

FIG. 9 presents oscilloscope traces of the preamplifier of the present invention with pulsed source feedback during reset.

FIG. 10 presents an oscilloscope trace of output of the preamplifier of the present invention with small leakage current.

DETAILED DESCRIPTION OF THE PREFERRED EMBODIMENTS

Figure 8:
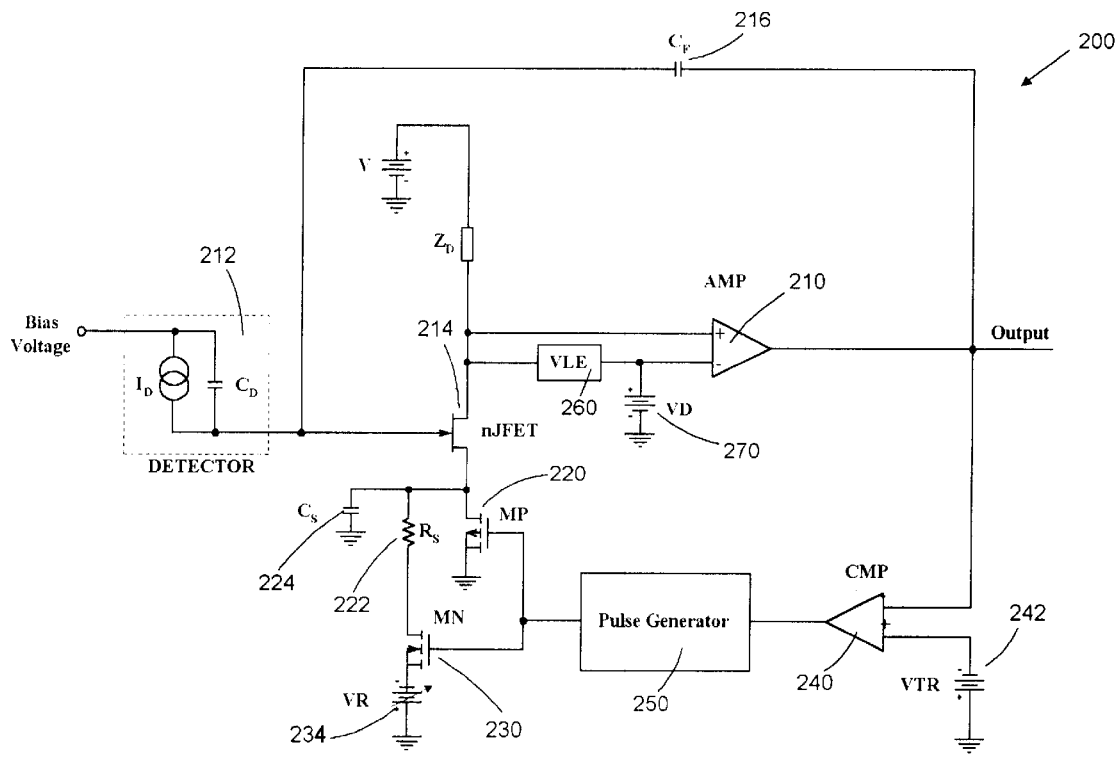
FIG. 8 is a block/schematic diagram of a practical realization of a preamplifier with pulsed source feedback, according to the present invention.

Reference should now be made to the drawing figures on which similar or identical elements are given consistent identifying numerals throughout the various figures thereof, and on which parenthetical references to figure numbers direct the reader to the view(s) on which the element(s) being described is (are) best seen, although the element(s) may be seen on other figures also.

FIG. 1 illustrates a basic charge sensitive preamplifier, generally indicated by the reference numeral 20, that includes a charge sensitive amplifier 22, connected to receive a pulse from a radiation detector 24. As noted above, charge sensitive amplifier 22 is a negative feedback, closed loop amplifier with a capacitive feedback element 30. Charge received at the input node of amplifier 22 unbalances the amplifier which responds by making a step function change in the output, $V_o$, sufficient to inject an equal but opposite charge at the input node, thereby re-balancing the circuit.

FIG. 2 illustrates the basic circuit of FIG. 1, generally indicated by the reference numeral 40, having an amplifier 42 connected to receive an input from a radiation detector 44, and having a feedback capacitor 46. This addresses the situation described above in which, in the usual situation, input signals continue to occur one after another and amplifier 42 eventually saturates, that is, $V_o$ will reach the limit of the dynamic range of the amplifier and no further signals can be processed. To remedy this situation, a large value resistor, $R_F$, 50 is added in parallel with feedback capacitor 46. Resistor 50 provides a continuous discharge path for the charge stored in capacitor 46 and, thus, amplifier 42 will remain in operation as long as the current from detector 44 does not exceed the current capacity (given the output voltage limit of the amplifier) of feedback resistor 50. Unfortunately, as mentioned above, feedback resistor 50 is a source of noise, which degrades the resolution of the detector.

FIG. 3 illustrates a pulsed-optical reset method of resetting, the circuit thereof being generally indicated by the reference numeral 60 which includes a non-inverting amplifier(AMP) 62 connected to receive an input pulse from a radiation detector 64 through a field effect transistor (JFET) 70 with drain load $Z_D$ 63 and having a feedback capacitor 66. JFET 70 is illuminated by a light-emitting diode (LED) 80 connected to receive the output of AMP 62 through a reset control circuit 82. LED 80 illuminates JFET 70 momentarily, but intensely, causing charge conduction from the drain to the gate of the JFET. This charge pulse causes AMP 62 to quickly return to its original starting condition. As noted above, there are several shortcomings in pulsed optical reset preamplifiers. Light from the LED must be isolated from the detector element, the JFET can take a long time for full recovery following illumination, and the circuit does not work for positively biased detectors.

Although JFET 70 and $Z_D$ 63 are shown as a separate elements on FIG. 3 for illustrative purposes, as are similar elements on subsequent FIGS. 4–8, it will be understood that JFET 70 with $Z_D$ 63 is actually the input stage of AMP 62. FIG. 4 illustrates a transistor reset circuit, generally indicated by the reference numeral 90, with AMP 92 connected to receive an input from a radiation detector 94 through a JFET 96 with drain load $Z_D$ 93 and having a feedback capacitor 98 and a reset control circuit 100. Circuit 90 employs a transistor switch 100 connected to the gate of the JFET to discharge the feedback capacitor 98. The transistor switch is driven by a comparator circuit (not separately shown) in much the same manner as in the case of a pulsed-optical reset preamplifier (FIG. 3). By the correct choice of transistor switch 102 and drive circuitry, circuit 90 can be used with negatively or positively biased detectors, and the spurious effects of light on JFET 96 are eliminated. The additional noise and capacitance of transistor 102 on the input of AMP 92 exacts a heavy penalty in noise, however, so these preamplifiers are not suitable for low energy detectors where noise plays a large role in detector resolution.

FIG. 5 illustrates a charge pump pulse reset preamplifier circuit, generally indicated by the reference numeral 110 which includes an AMP 112 connected to receive an input from a radiation detector 114 through a JFET 116 with drain load $Z_D$ 113 and having a feedback capacitor 118. Circuit 110 applies a reset pulse through a reset control circuit 118 through a capacitor CB 120. Through the capacitance of capacitor CB 120 and the capacitance CD of detector 114, a pulse is applied to the gate of JFET 116. If the amplitude of this pulse is sufficient to forward bias the gate-source junction of JFET 116, charge is removed from feedback capacitor 118. As noted above, proper operation of this circuit depends on the detector capacitance which may not be stable and with some detectors the electrode structure may prevent efficient reset and may cause polarization of secondary electrodes as a result of resetting.

FIG. 6 illustrates a circuit for resetting by forward biasing the drain-gate junction of the JFET, the circuit being generally indicated by the reference numeral 130 that includes an AMP 132 connected to receive an input from a radiation detector 134 through a JFET 136 with drain load $Z_D$ 133 and having a feedback capacitor 138 and a reset control circuit 140. In this method, a negative pulse is applied to the drain node of JFET 136. If the pulse amplitude is sufficient, the gate-drain junction of the JFET becomes forward biased and feedback capacitor 136 is discharged. Circuit 130 requires that the input of AMP 132 and the drain load $Z_D$ 133 to be driven to the same potential as the drain. The reactive components on the drain load are energized during reset and AMP 132 is overloaded which may lead to extensive recovery time. As noted above, because of the circuit arrangement, it is not possible to incorporate a circuit to limit the drain voltage excursion during reset.

FIG. 7 illustrates a preamplifier circuit with pulsed source reset, according to the present invention, and generally indicated by the reference numeral 150. Circuit 150 includes an AMP 160 that is connected to receive a pulse input from a radiation detector 162 through a JFET 164 with drain load $Z_D$ 163, a feedback capacitor 166 and a reset control circuit 168.

This particular arrangement and the following discussion applies to detectors operating with positive bias and with n-channel JFETs. For detectors operating with negative bias, a p-channel JFET is required and reset pulse polarity is reversed.

Circuit 150 includes a switch (SW) 170 that is connected in the source of JFET 164. In normal operation, switch 170 grounds the source of JFET 164. When the circuit output voltage reaches a preset threshold, reset control circuit 168 generates a short pulse. This pulse causes switch 170 to connect source of JFET 164 to a reset voltage source (VR) 180. During reset, a source capacitor ($C_S$) 190 is charged through the resistance (not shown) of switch 170 and the source voltage moves in a direction to forward bias the gate-source p-n junction of JFET 164. AMP 160 saturates quickly, fixing the output voltage. When the gate-source voltage of JFET 164 becomes forward biased, charge is removed from the gate node by the current flowing through the gate-source junction. For a given JFET 164, the amount of charge removed depends on the duration of the pulse generated by reset control circuit 168, the reset voltage (VR) 180, and the switch resistance. If two of these parameters are fixed (e.g., pulse duration and switch resistance), the third can be varied in order to control the amount of charge removed during reset.

FIG. 8 illustrates a practical realization of a preamplifier circuit, with pulsed source feedback, and generally indicated by the reference numeral 200. Circuit 200 includes an AMP 210, connected to receive a pulse input from a radiation detector 212 through a JFET 214 with drain load $Z_D$ 213, and having a feedback capacitor 216. In the case of positive biased detector 212 and a JFET 214 comprising an n-channel JFET, a positive charge is delivered to the gate node of JFET 214. Under these circumstances, the leakage and signal current cause the output of the preamplifier to decrease gradually. Normally, the source of JFET 214 source is connected to ground and the JFET operates as a common source amplifier. In the present circuit, the source is connected to a p-type power MOSFET (MP) 220, a resistor ($R_S$) 222, and a capacitor ($C_S$) 224. In normal (charge sensing) operation, MP 220 is saturated, having a resistance typically less than 0.1 Ω. An N-channel MOS transistor 230 is connected between $R_S$ 222 and a voltage source (VR) 234. The gates of both MOS transistors 220 and 230 are tied together in a configuration similar to that of a CMOS inverter. Power P-MOS transistor 220 offers very low resistance when completely turned on and provides a low noise ground to the source of JFET 214. The noise contribution of MOSFET 220 is negligible compared to the thermal noise of JFET 214.

The output of the preamplifier is applied to a comparator (CMP) 240 with a threshold set by a voltage source (VTR) 242. When the output signal reaches the threshold, the output of comparator 242 becomes active, enabling a pulse generator 250. Pulse generator 250 produces a short pulse (1–2 μs or less in duration). Normally, the output of pulse generator 250 is sufficiently negative to completely turn on MP 220 and to turn off MN 230. During a reset, pulse generator 250 turns off MP 220 and turns on MN 230, which drives the source in the negative direction.

While the source voltage decreases, the gate voltage of JFET 214 also decreases, due to the induced charge through source-gate capacitance. The rate of change of the gate voltage of JFET 214, however, is lower than the rate of change of the source voltage. This is due to the fact that the detector capacitance, the feedback capacitance, and the drain-gate capacitance absorb some of the induced charge—in other words, the source-gate capacitance and the rest of the capacitance connected to the gate node form a divider. The drain current increases until it reaches the saturation current of JFET 214. At this point, the drain voltage almost stabilizes. The source-drain capacitance has practically no effect, due to the low resistance of the JFET. Thus, both the detector capacitance and the drain-gate capacitance cause the gate voltage to change at a lower rate than the rate at which the source voltage is pulled down. As a result, there is a point at which the gate-source junction becomes forward biased and a discharge current starts flowing from the gate to the source. The duration of the current flow and its magnitude determine the charge that is removed from the capacitance connected to the gate of JFET 214.

FIGS. 9 and 10 show oscilloscope traces of various internal and external signals of circuit 200 (FIG. 8).

Factors that determine the magnitude of gate capacitance discharge (reset) are the duration of the reset pulse, the reset voltage, resistance $R_S$ 222, the resistance of MN 230, the capacitance $C_S$ 224, the characteristics of AMP 210, and the p-n junction properties of JFET 214 (FIG. 8). Circuit 200 is easy to adjust if only one parameter is used for this purpose. It is convenient to use voltage source VR 234 to adjust the magnitude of the reset. It is within the contemplation of the present invention that VR 234 can be adjusted manually or automatically. The JFET 214 drain voltage is stabilized during reset by voltage limiting element (VLE) 260 connected to the drain of JFET 214 and voltage source (VD) 270. VD 270 determines the drain voltage during reset.

In the embodiments of the present invention described above, it will be recognized that individual elements and/or features thereof are not necessarily limited to a particular embodiment but, where applicable, are interchangeable and can be used in any selected embodiment even though such may not be specifically shown.

It will thus be seen that the objects set forth above, among those elucidated in, or made apparent from, the preceding description, are efficiently attained and, since certain changes may be made in the above construction and method without departing from the scope of the invention, it is intended that all matter contained in the above description or shown on the accompanying drawing figures shall be interpreted as illustrative only and not in a limiting sense.

It is also to be understood that the following claims are intended to cover all of the generic and specific features of the invention herein described and all statements of the scope of the invention that, as a matter of language, might be said to fall therebetween.

The embodiments of the invention in which an exclusive property or privilege is claimed are defined as follows:

1. A charge sensitive preamplifier for a radiation detector, comprising:
   (a) an amplifier having a JFET input stage and a capacitive feedback element, said amplifier producing an output voltage (pulse) proportional to a charge (pulse) deposited at said JFET input by said radiation detector; and (b) a circuitry connected to said amplifier output and to a source node of said JFET to provide to said source node a pulsed reset signal.

2. A charge sensitive preamplifier for a radiation detector, as defined in claim 1, further comprising: a switch connected to said source node of said JFET that grounds said source node of said JFET between resets of said charge sensitive preamplifier.

3. A charge sensitive preamplifier for a radiation detector, as defined in claim 1, further comprising:
   (a) a first voltage source; and
   (b) a switch connected to said voltage source and to a source of said JFET and to ground, such as to forward bias a gate-source p-n junction of said JFET during reset and to ground said gate-source p-n junction of said JFET between resets.

4. A charge sensitive preamplifier, as defined in claim 3, further comprising: reset control circuitry connected to said voltage output and to said switch to control operation of said switch.

5. A charge sensitive preamplifier, as defined in claim 4, further comprising: a source capacitor connected to said source of said JFET, which source capacitor is charged during reset.

6. A charge sensitive preamplifier, as defined in claim 1, wherein said circuitry comprises:
   (a) said source of said JFET being parallely connected to a source capacitor, to a power MOSFET, and to a resistor connected to a MOS transistor;
   (b) a second power source connected to said MOS transistor; and
   (c) a pulse generator connected to said voltage output and to gates of said MOSFET and said MOS transistor.

7. A charge sensitive preamplifier, as defined in claim 6, further comprising:
   (a) a comparator connected between said voltage output and to said pulse generator; and
   (b) a third voltage source connected to said comparator, such as to set a threshold thereof.

8. A charge sensitive preamplifier, as defined in claim 1, further comprising a voltage limiting element connected between a drain of said JFET and a fourth voltage source, such as to set JFET drain voltage during reset thereof.

9. A method of operating a charge sensitive preamplifier for a radiation detector, comprising:
   (a) providing a JFET input stage;
   (b) providing an amplifier for connection to said JFET input stage to receive therethrough as an input a pulse output of said radiation detector and to provide a voltage output representative of said pulse output; and
   (c) providing to a source node of said JFET a pulsed feedback from said voltage output.

10. A method of operating a charge sensitive preamplifier for a radiation detector, as defined in claim 9, further comprising: grounding said source node of said JFET between resets of said charge sensitive preamplifier.

11. A method of operating a charge sensitive preamplifier for a radiation detector, as defined in claim 9, further comprising: forward biasing a gate-source p-n junction of said JFET during reset and grounding said gate-source p-n junction of said JFET between resets.

12. A method of operating a charge sensitive preamplifier, as defined in claim 11, further comprising: providing forward biasing or grounding depending on level of said voltage output.

13. A method of operating a charge sensitive preamplifier, as defined in claim 12, further comprising: charging during reset a source capacitor connected to said source of said JFET.

14. A charge sensitive preamplifier, as defined in claim 9, wherein said step of providing to a source node comprises:
   (a) providing said source of said JFET parallely connected to a source capacitor, to a power MOSFET, and to a resistor connected to a MOS transistor;
   (b) providing a second power source connected to said MOS transistor; and
   (c) providing a pulse generator connected to said voltage output and to gates of said MOSFET and said MOS transistor.

15. A method of operating a charge sensitive preamplifier, as defined in claim 14, further comprising:
   (a) providing a comparator connected between said voltage output and to said pulse generator; and
   (b) providing a third voltage source connected to said comparator, such as to set a threshold thereof.

16. A method of operating a charge sensitive preamplifier, as defined in claim 9, further comprising a voltage limiting element connected between a drain of said JFET and a fourth voltage source, such as to set a JFET drain voltage during reset thereof.

17. A charge sensitive preamplifier for a radiation detector, comprising:
   (a) an amplifier having a JFET input stage and a capacitive feedback element, said amplifier producing an output voltage (pulse) proportional to a charge (pulse) deposited at said JFET input by said radiation detector;
   (b) a circuitry connected to said amplifier output and to a source node of said JFET to provide to said source node a pulsed reset signal;
   (c) a first voltage source; and
   (d) a switch connected to said voltage source and to a source of said JFET and to ground, such as to forward bias a gate-source p-n junction of said JFET during reset and to ground said gate-source p-n junction of said JFET between resets.

18. A charge sensitive preamplifier, as defined in claim 17, further comprising: reset control circuitry connected to said voltage output and to said switch to control operation of said switch.

19. A charge sensitive preamplifier, as defined in claim 18, further comprising: a source capacitor connected to said source of said JFET, which source capacitor is charged during reset.

20. A charge sensitive preamplifier for a radiation detector, comprising:
   (a) an amplifier having a JFET input stage and a capacitive feedback element, said amplifier producing an output voltage (pulse) proportional to a charge (pulse) deposited at said JFET input by said radiation detector;
   (b) a circuitry connected to said amplifier output and to a source node of said JFET to provide to said source node a pulsed reset signal;
   (c) said source of said JFET being parallely connected to a source capacitor, to a power MOSFET, and to a resistor connected to a MOS transistor;
   (d) a second power source connected to said MOS transistor; and
   (e) a pulse generator connected to said voltage output and to gates of said MOSFET and said MOS transistor.

21. A charge sensitive preamplifier, as defined in claim 20, further comprising:

(a) a comparator connected between said voltage output and to said pulse generator; and (b) a third voltage source connected to said comparator, such as to set a threshold thereof.

22. A charge sensitive preamplifier for a radiation detector, comprising:

(a) an amplifier having a JFET input stage and a capacitive feedback element, said amplifier producing an output voltage (pulse) proportional to a charge (pulse) deposited at said JFET input by said radiation detector;

(b) a circuitry connected to said amplifier output and to a source node of said JFET to provide to said source node a pulsed reset signal; and (c) a voltage limiting element connected between a drain of said JFET and a fourth voltage source, such as to set JFET drain voltage during reset thereof.

* * * * *